Aug. 25, 1959 L. O. HUBBARD 2,901,557

OSCILLATOR AND AMPLIFIER CIRCUIT

Filed Feb. 7, 1955

INVENTOR.
LINUS O. HUBBARD
BY Geo. G. Hyde
ATTORNEY 2,901,557
Patented Aug. 25, 1959

2,901,557

OSCILLATOR AND AMPLIFIER CIRCUIT

Linus O. Hubbard, Chicago, Ill., assignor to Bendix Aviation Corporation, Davenport, Iowa, a corporation of Delaware Application February 7, 1955, Serial No. 486,541

8 Claims. (Cl. 179—171)

This invention relates to electronic oscillation generators and amplifiers, and particularly to an improved arrangement for coupling an oscillating circuit to a push-pull type amplifier circuit. It is especially adapted for use with an oscillating circuit of the type in which the control grid and anode of an oscillator tube are coupled to opposite end sections of an inductance forming, in conjunction with parallel capacity, the tank circuit. The output from this type of oscillator is normally taken from the anode circuit through transformer, resistance or other coupling, by which it may be fed to an amplifier stage in known manner.

A general object of the invention is to provide an improved, simplified and more efficient coupling arrangement between an oscillator circuit of this type and a push-pull amplifier circuit.

While the invention has features suitable for use with various oscillator circuits such as the Colpitts and the Hartley circuits, it includes features that are especially advantageous when used with the Hartley circuit. An object therefore is to improve the efficiency of a Hartley type oscillator circuit. The harmonic voltages produced by this circuit tend to be larger than those of some other oscillators, due to the absence of a low impedance cathode return. A novel arrangement for coupling a Hartley oscillator to a push-pull amplifier stage is provided in which the latter will effectively reduce or substantially eliminate such harmonics.

A further purpose is to improve the operation of a push-pull amplifier circuit. The output of such a circuit is reduced if the voltages to the control grids of the two tubes are not 180° out of phase. A feature of the invention is an arrangement for coupling an oscillator circuit with a push-pull circuit to provide and maintain the required phase relationship in the amplifier in novel manner.

The foregoing and other objects and advantages of the invention will appear more fully from consideration of the detailed description which follows, in conjunction with the accompanying drawing wherein two embodiments of the invention are illustrated. It is to be expressly understood, however, that the drawing is for the purposes of illustration and descripion and is not to be construed as defining the limits of the invention.

Figure 1:
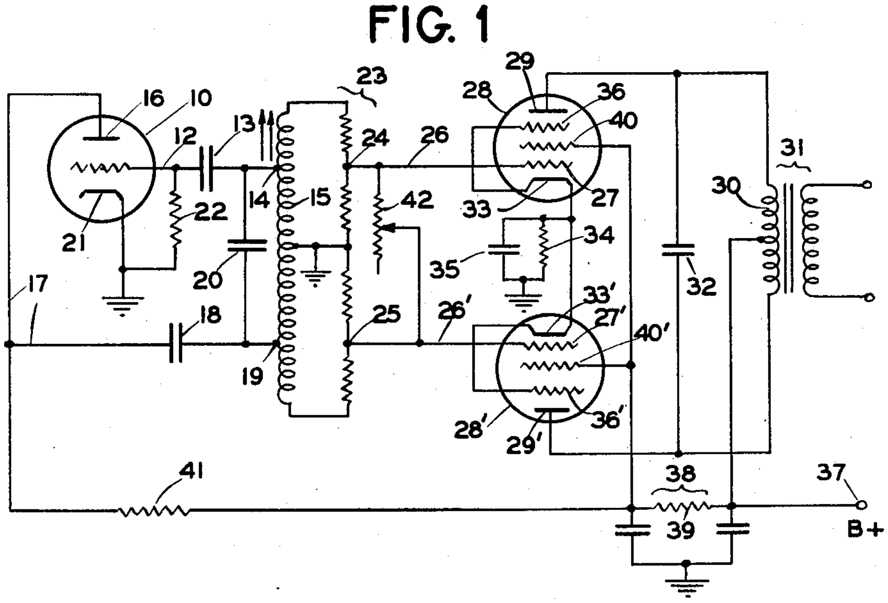
Fig. 1 is a circuit diagram of one embodiment of the invention.

In the form shown in Fig. 1 an oscillator circuit of the Hartley type is employed, the triode 10 having a grid 11 connected by lead 12 through grid condenser 13 to a point 14 on tank inductance 15 spaced from one end thereof. The plate 16 of tube 10 is connected through leads 17 and blocking condenser 18 to a point 19 in tank inductance 16 adjacent to the other end. The tank condenser 20 is connected across leads 12 and 17 in parallel to the central section of inductance 15 between points 14 and 19. Cathode 21 and grid bias resistor 22, connected to lead 12, are grounded, as is the center point of tank inductance 15.

The circuit so far described is a Hartley oscillator. The grid and plate connections 14 and 19 are located at points selected to match the impedance of tube 10, the inductance 15 being extended beyond these points to provide a desired higher voltage. Inductance 15 may be slug tuned as indicated.

A coupling resistance 23 is connected in parallel across end sections, preferably the ends, of inductance 15, and grounded at its center point. Taps at points 24 and 25 opposite in phase are connected by leads 26, 26′ to control grids 27, 27′ of amplifier tubes 28, 28′ connected in a push-pull circuit. In the form shown, the latter tubes are pentodes, with plates 29, 29′ connected across the primary 30 of output transformer 31, and condenser 32 between the plates in parallel to primary 30. Cathodes 33, 33′ are connected to suppressor grids 36, 36′ and through bias resistor 34 and by-pass condenser 35 to ground. A source of plate potential 37 is connected through a center point of transformer primary 30 to plates 29, 29′, also through a filter network 38, including a dropping resistor 39, to screen grids 40, 40′ of tubes 28, 28′, and through load resistor 41 and lead 17 to plate 16 of the oscillator tube 10.

This arrangement is of course a push-pull amplifier circuit; and a suitable gain control is incorporated therein. In the form shown in Fig. 1 this is provided by rheostate 42 shunted across grid input leads 26, 26′.

The described arrangement provides a simplified and efficient coupling between the oscillator and push-pull amplifier circuits which avoids difficulties inherent in the usual plate circuit take-off. The take-off from the tank inductance facilitates the maintenance of balanced input to the push-pull tube grids 27, 27′, and the maintenance of the necessary accurate phase opposition. Completely accurate balancing can readily be obtained by properly locating the points 24, 25 on the coupling resistor 23.

Moreover, this combination is especially advantageous with the Hartley circuit because of the tendency of this circuit to produce more harmonics than other oscillators as already noted, and the effective elimination of these harmonics in the push-pull circuit shown. It has also been found that in this arrangement the cathode condenser 35 is unexpectedly effective in eliminating the higher hormonics, and thereby improves the wave form of the amplifier output. The circuit likewise facilitates the generation at accurately controlled frequencies of voltages adequate to satisfy the requirements of various selected designs of the push-pull amplifier. Moreover, the provision of sections of resistor 23 in the grid input circuits insures adequate resistance in said circuits at all times, preventing grid current from becoming a factor.

Figure 2:
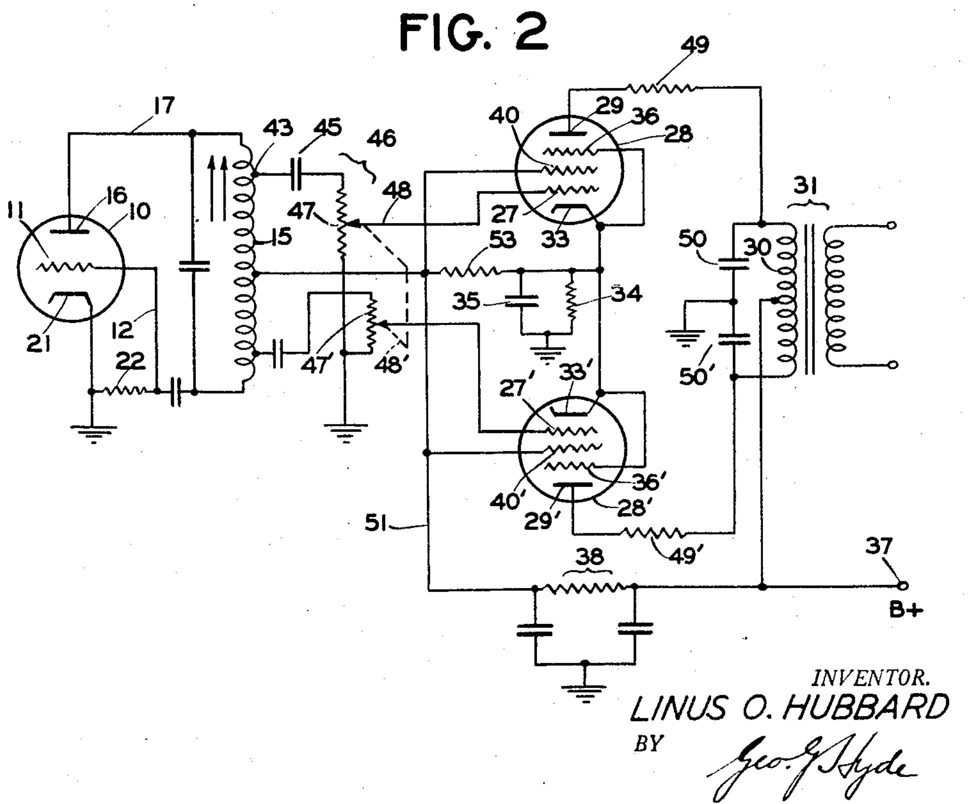
Fig. 2 is a similar diagram of a modification thereof.

In the embodiment shown in Fig. 2, similar parts of the oscillator circuit bear similar numbers, since the circuit is largely the same, except that the plate 16 and control grid 11 are shown as connected to the ends of the tank inductance 15. Points 43, 44 on tank inductance 15 are connected through blocking condensers 45 to the ends of the coupling resistor 46, the center point of which is grounded. Resistor 46 is arranged in two sections at opposite sides of the ground, advantageously formed by potentiometers 47, 47′ with contact arms 48, 48′ mechanically ganged and arranged so that the two contacts are at all times symmetrically located with respect to the ends of resistor 46. Potentiometer arms 48, 48′ are connected to control grids 27, 27′ of tubes 28, 28′, and provide a gain control. The plates 29, 29′ are connected through parasitic suppressors 49, 49′ to opposite ends of primary 30 of output transformer 31, and through condensers 50, 50′ to ground.

The source of plate voltage 37 is similarly connected to the center point of transformer primary 30, and through the filter network 38 and lead 51 to screen grids 40, 40′. Lead 51 is also connected through dropping resistor 53 to cathodes 33, 33′, which are likewise connected to suppressor grids 36, 36', and through resistor 34 and parallel condenser 35 to ground. Lead 51 is also connected to tank inductance 15 to provide voltage for plate 16. This arrangement has the advantage of maintaining at all times the same load across the tank inductance 15, regardless of the setting of potentiometers 47, 47'.

It is pointed out that in this arrangement the coupling resistance 46 is tapped across only a portion of the oscillator tank circuit. This correspondingly reduces the effect on the oscillator circuit of the grid capacity of the push-pull tubes 28, 28', which may be a factor where high accuracy in the output is required.

The two embodiments of the invention described and illustrated contain certain features that are interchangeable; but the various combinations that this makes possible have not been shown in order to avoid unnecessarily complicating the disclosure. For instance, while the ganged potentiometers have been illustrated only in Fig. 2, they may obviously be used in the circuit shown in Fig. 1. Likewise the connection of the grid and plate leads to intermediate points of the tank inductance 15 in Fig. 1 whereas these leads are connected to the ends of the inductance in Fig. 2, and the connection of the resistor unit 46 to intermediate points of the inductance in Fig. 2 and to the ends of the inductance in Fig. 1, are interchangeable features.

It is not material to the invention whether the two amplifier tubes are enclosed within the same or separate envelopes and the term tubes as used herein is intended to refer to both forms.

Furthermore, although but two embodiments of the invention have been illustrated and described in detail, and certain variations therein have been indicated, it is to be expressly understood that the invention is not limited to this specific disclosure. Various other changes can be made in the design and arrangement of the parts without departing from the spirit and scope of the invention as the same will now be understood by those skilled in the art.

I claim:

1. An electronic oscillator and amplifier system, comprising an oscillator circuit including a tank inductance and an electron discharge tube including a control grid and a cathode and an associated plate coupled to said control grid and cathode through said inductance, an amplifier circuit including two electron discharge tubes connected in push-pull relation, each including a control grid and a plate, a coupling circuit connecting one control grid with a point on the tank inductance, a second coupling circuit connecting the other control grid with another point on the tank inductance in phase opposition to the former point, a grid radio frequency current minimizing resistance in each of the latter two circuits, an output impedance, and an output circuit connecting the amplifier tube plates across said impedance.

2. An electronic oscillator and amplifier system, comprising an oscillator circuit including a tank inductance and an electron discharge tube including a control grid and a cathode and an associated plate coupled to said control grid and cathode through said inductance, a coupling resistor unit connected in parallel between points of opposite phase on the inductance, said resistor unit including two potentiometer resistance in series, an amplifier circuit including two electron discharge tubes connected in push-pull relation, each including a control grid and a plate, coupling circuits connecting said control grids and points on said resistor opposite in phase, including potentiometer arms slidably engaging said potentiometer resistances and connected to said coupling circuits, an output impedance, and an output circuit connecting the amplifier tube plates across said impedance.

3. An electronic oscillator and amplifier system, comprising an oscillator circuit including a tank inductance and an electron discharge tube including a control grid and a cathode and an associated plate coupled to said control grid and cathode through said inductance, a coupling resistor unit connected in parallel between points of opposite phase on the inductance, an amplifier circuit including two electron discharge tubes connected in push-pull relation, each including a control grid and a plate, coupling circuits connecting said control grids to points on said resistor opposite in phase and spaced from opposite ends of the resistor unit, arranged to provide a resistance in each coupling circuit between the control grid and the inductance, an output impedance, and an output circuit connecting the amplifier tube plates across said impedance.

4. An electronic oscillator and amplifier system, comprising an oscillator circuit including a tank inductance and an electron discharge tube including a cathode electrically connected to the center of the inductance, a control grid and an associated plate coupled through said inductance, a resistor unit connected in shunt between points of opposite phase on the inductance, the center of the unit having a ground connection, an amplifier circuit including two electron discharge tubes connected in push-pull relation, each including a control grid and a plate, coupling circuits connecting said control grids with points on the tank inductance at opposite sides of said ground connection, an output impedance, and an output circuit connecting the amplifier tube plates across said impedance.

5. An electronic oscillator and amplifier system, comprising an oscillator circuit including an electron discharge tube having a plate and an associated control grid, a tank circuit including a tank inductance having its ends coupled to said grid and plate respectively, a source of plate potential connected to a central point on said inductance, a blocking condenser between the inductance and the grid, an amplifier circuit including two electron discharge tubes connected in push-pull relation, each having a control grid and a plate, an output circuit having ends connected to points of opposite phase on said inductance and including a resistor unit and blocking condensers between the ends of the unit, said points and coupling circuits connecting said control grids with points opposite in phase on the resistor unit, an output impedance, and an output circuit connecting the amplifier tube plates across said impedance.

6. An electronic oscillator and amplifier system comprising an oscillator circuit including a tank inductance and an electron tube including a control grid and a cathode and an associated plate coupled to said control grid and cathode through said inductance, an amplifier circuit including two electron tubes connected in push-pull relation, each including a cathode, a control grid, and a plate, a circuit path for alternating currents extending from the electrical mid-point of said inductance to the cathode of each amplifier tube, coupling circuits connecting the control grids of said amplifier tubes with points on said inductance in phase opposition, an output impedance, and an output circuit connecting the amplifier tube plate across said impedance.

7. The invention defined in claim 6 in which each of said coupling circuits comprises a series resistor, and a resistor interconnecting said coupling circuits.

8. The invention defined in claim 7 including a circuit path for alternating currents extending from the electrical mid-point of the interconnecting resistor to the cathode of each of said amplifier tubes.

References Cited in the file of this patent

UNITED STATES PATENTS

| | | |
|---|---|---|
| 1,751,232 | Davies et al. | Mar. 18, 1930 |
| 1,755,865 | Butler | Apr. 22, 1930 |
| 2,607,830 | Razek | Aug. 19, 1952 |

FOREIGN PATENTS

| | | |
|---|---|---|
| 107,119 | Australia | Apr. 4, 1939 |